US005768297A

United States Patent [19]

Shor

[11] Patent Number: 5,768,297
[45] Date of Patent: Jun. 16, 1998

[54] METHOD FOR REDUCING DECOHERENCE IN QUANTUM COMPUTER MEMORY

[75] Inventor: Peter W. Shor, New Providence, N.J.

[73] Assignee: Lucent Technologies Inc., Murray Hill, N.J.

[21] Appl. No.: 548,923

[22] Filed: Oct. 26, 1995

[51] Int. Cl.[6] .................................................. G06F 11/08
[52] U.S. Cl. ........................................................ 371/40.11
[58] Field of Search ............................ 371/37.1, 37.4, 371/40.11, 40.2

[56] References Cited

PUBLICATIONS

Lloyd, "Quantum–Mechanical Computers", Oct. 1995, Scientific American.
Cirac, et al., "Quantum Computations with Cold Trapped Ions", May 1995, Physical Review Letters.
Brown, "A Quantum Revolution for Computing", Sep. 1994, New Scientist.
Hayes, "The Square Root of NOT", Jul. 1995, Computing Science.
Brassard, "A Quantum Jump in Computer Science", 1995, Computer Science Today.

*Primary Examiner*—Stephen M. Baker

[57] ABSTRACT

The present invention is a methodology for reducing the rate of decoherence in quantum memory. A procedure is disclosed for storing an arbitrary state of n qubits using expanded groupings of these n qubits in a decoherence-resistant manner. Each qubit of the original n qubits is mapped into a grouping of qubits, and the process will reconstruct the original superposition simultaneously correcting both bit and phase errors if at most one qubit decoheres in each of these groups of qubits. In one preferred embodiment of the present invention, a method is disclosed for decoding a set of N'(2m+1) qubits, wherein the set of N'(2m+1) exposed qubits has undergone possible decoherence from a superposition of states due to exposure to an environment. The method comprises the steps of decoding the set of N'(2m+1) exposed qubits using a repetition decoder to yield a set of N' decoded qubits, applying a first transformation to each decoded qubit in the set of said N' decoded qubits to yield a set of N' transformed decoded qubits, wherein the first transformation is represented as a unitary matrix comprising matrix entries of equal absolute value, and decoding the set of N' transformed decoded qubits using an error correcting decoder to yield a set of n decoded qubits.

27 Claims, 5 Drawing Sheets

CONTROLLED NOT

FIG. 2A

FUNCTION $F_1$

WHERE ⊗ = CONTROLLED NOT

FIG. 4C

WHERE ⌣ INDICATES APPLY $\begin{pmatrix} \frac{1}{\sqrt{2}} & \frac{1}{\sqrt{2}} \\ \frac{1}{\sqrt{2}} & \frac{1}{\sqrt{2}} \end{pmatrix}$

WHERE ◯ = MEASURE BIT IN $\{|0\rangle, |1\rangle\}$ BASIS

FIG. 5C

IF $b_2 = b_3 = 1$, NEGATE QUBIT 1

IF $b_5 = b_6 = 1$, NEGATE QUBIT 4

IF $b_8 = b_9 = 1$, NEGATE QUBIT 7

WHERE △ = NEGATE = APPLY UNITARY TRANSFORMATION
$$\begin{pmatrix} 0 & 1 \\ 1 & 0 \end{pmatrix}$$

IF $b_2 = b_7 = 1$, NEGATE QUBIT 1

WHERE △ = NEGATE = NOT

METHOD FOR REDUCING DECOHERENCE IN QUANTUM COMPUTER MEMORY

FIELD OF THE INVENTION

The present invention relates to the field of error correcting codes, and more particularly to an error correcting code for use with quantum computational data.

BACKGROUND OF THE INVENTION

Electronic computers are devices that execute logical operations on binary digits (bits). Each bit is a single binary digit from the set of binary numbers {0,1}, or alternatively, each bit is in one of either a "0" or a "1" state. Each bit is manifested in the electronic computer by an electrical signal, for example, as by the absence (i.e. the bit is in the "0" state) or presence (i.e. the bit is in the "1" state) of an electrical charge in a corresponding portion of a memory device (such as a random access memory device). Logical operations, such as the well known AND and NOT operations, may be used as the basis for performing sophisticated electronic computations, such as the arithmetic operations of multiplication and addition, on the data. Advances in the design of components for executing logical operations and in the design of algorithms which order the execution of logical operations have increased the capabilities of electronic computers and lowered their cost. As a consequence, electronic computers have become an integral part of consumer and business operations.

Recently, interest has been growing in an area called quantum computation. In quantum computation, calculations are performed on quantum data. Each unit of quantum data is referred to as a "qubit" which qubit may be in a "superposition" of states between a ground (or "0") state and an excited state (or a "1" state). Quantum states and their superpositions are typically represented by means of a notational convention called a "ket," written "|>." The state of the qubit is given as $\alpha|0\rangle + \beta|1\rangle$, where the coefficients $\alpha$ and $\beta$ are the probability amplitudes (or more simply, the amplitudes) of each state. Thus, in the case where $\alpha$ is "0" ("1") and $\beta$ is "1" ("0"), the quantum data reduces to binary digits. In general, the amplitudes are complex numbers having a real and imaginary part. The amplitudes associated with a state determines the probability that a qubit will be found in that state. Specifically, the probability is equal to the square of the absolute value of the corresponding amplitude.

Calculations on quantum data may be performed by a quantum computer. The quantum computer advantageously comprises memory cells capable of storing the quantum data. Note that while k units of electronic memory may take on $2_k$ states thereby requiring k bits to describe the units, k memory cells in which qubits are stored require $2^k - 1$ complex numbers to completely represent their state. A quantum computer obeys the laws of quantum mechanics. Consequently, a feature of a quantum computer is that it may execute a set of operations on each of the superimposed states of the contents of the memory cells simultaneously. Each memory cell represents or stores one qubit where, as noted above, each qubit is in a superposition of states. The execution of the operations on quantum data in memory cells causes the states in superposition in the memory cell quantum data to interfere with each other thereby rendering the quantum data resulting from the execution, which may also be advantageously stored in memory cells, to be a function of the interference. As a result of this interference, operations that are difficult to execute or problems which are intractable on electronic computers may be easily executed or solved on a quantum computer.

One scheme for implementing quantum gates and memory cells involves "quantum dots" which are isolated conductive regions within a semiconductor substrate. Each quantum dot can hold a single electron, whose presence or absence represents one qubit of information. When a single dot is exposed to a pulse of light of the proper frequency and duration, the corresponding electron moves into an excited energy state. An additional pulse of light, of proper frequency and duration, may knock the electron back into its ground state again.

In a quantum computer, the ground state and the excited state of the electron are used to represent "0" and "1" just as in standard computing in electronic devices. Thus a single quantum dot can act as a one bit memory device or register. The single quantum dot may also behave as the well-known logical NOT gate common in electronic devices because a pulse of light may turn a "0" into a "1" and a "1" into a "0". Using a more elaborate arrangement involving pairs of quantum dots, it is possible to create other quantum gates which execute logical functions in quantum computers (such as the XOR function also used in electronic devices).

Although the logic functions found in conventional electronic technology may have analogs in quantum technology, there are operations that may be performed by quantum logic gates or structures that are not replicated by electronic systems. For example, consider the quantum dot NOT gate described above. Such a structure is based on the phenomena that light, of the proper frequency and duration, shone on the dot will cause the dot to change state, i.e. the qubit will flip states. Note, however, that if the light is shone for less than the proper duration, then according to principles of quantum mechanics, the quantum dot will go into what is called a superposition of states. This is a mixture of both the ground and excited states. One such function is termed the "square root of NOT" ($\sqrt{NOT}$) because if the operation is repeated a logical NOT function is performed, i.e. a quantum bit in the ground state (excited state) input to two successive $\sqrt{NOT}$ gates is output as a quantum bit in the excited state (ground state). Similar square root functions, also termed $\sqrt{}$functions, can be constructed for other logical functions. The importance of these $\sqrt{}$functions is that they have no analog in standard electronic computers. Such functions, however, may be very powerful because of their simultaneous computing abilities on the superposition of states. Present work on quantum gate technology is described in Cirac and Zoller, "Quantum Computations with Cold-Trapped Ions," *Physical Review Letters*, Vol. 74, No. 20, pp. 4091–4094, May 15, 1995; Brassard, "A Quantum Jump in Computer Science," *Computer Science Today*, Springer Verlag, 1995.

An obstacle that must be overcome in the use of a quantum computer is the decoherence of qubits. Decoherence may occur when the quantum computer is exposed to an environment which environment causes the state of one or more qubits in the computer to "collapse." By collapse it is meant that the probability amplitudes associated with the superposition of states are changed by the environment. Thus, collapsing causes a qubit to be partially or completely driven into either the ground or excited state. An environment is a process which introduces noise. Environments which may initiate the collapsing include environments comprising thermal noise, electric fields, etc. such as a fiber optic cable environment or an environment in which ions are suspended in an insufficient vacuum. Once a qubit has decohered, the computation of the quantum computer is corrupted, and the result of the computation will no longer be correct.

3

As a result of the decoherence process in quantum computation, there is a need for techniques for restoring qubits that have decohered to their original superposition of states.

SUMMARY OF THE INVENTION

The present invention is a method for reducing the rate of decoherence in quantum memory. The present invention discloses a procedure for storing an arbitrary state of n qubits using expanded groupings of these n qubits in a decoherence-resistant manner. Each qubit of the original n qubits is mapped into a grouping of qubits, and the process will reconstruct the original superposition simultaneously correcting both bit and phase errors if at most one qubit decoheres in each of these groups of qubits. Thus, even if one of the qubits decoheres, the original superposition can be reconstructed perfectly.

In one preferred embodiment of the present invention, a method is disclosed for decoding a set of N'(2m+1) qubits, wherein the set of N'(2m+1) exposed qubits has undergone possible decoherence from a superposition of states due to exposure to an environment. The method comprises the steps of decoding the set of N'(2m+1) exposed qubits using a repetition decoder to yield a set of N' decoded qubits, applying a first transformation to each decoded qubit in the set of said N' decoded qubits to yield a set of N' transformed decoded qubits, wherein the first transformation is represented as a unitary matrix comprising matrix entries of equal absolute value, and decoding the set of N' transformed decoded qubits using an error correcting decoder to yield a set of n decoded qubits. In the method, the said set of N'(2m+1) exposed qubits is generated by exposing a set of N'(2m+1) qubits to the environment.

The set of N'(2m+1) qubits is generated by encoding a set of n qubits using an error correcting coder to yield a set of N' qubits, wherein the error correcting coder is the inverse of the error correcting decoder, applying a second transformation to each qubit in the set of N' qubits to yield a set of N' transformed qubits, wherein the second transformation is the inverse of the first transformation, and encoding the set of N' transformed qubits using a repetition coder to yield the set of N'(2m+1) qubits, wherein the repetition coder is the inverse of said repetition decoder.

In one preferred embodiment of the present invention, the repetition decoder uses a repetition code of length 2m+1 in an inner layer to correct m bit errors and the error correcting decoder uses a repetition code of length 2L+1 in an outer layer to correct L phase errors. In another preferred embodiment the error correcting decoder uses a repetition code with minimum Hamming distance 2t+1 in an outer layer to correct t phase errors.

BRIEF DESCRIPTION OF THE FIGURES

For a better understanding of the present invention, reference may be had to the following description of exemplary embodiments thereof, considered in conjunction with the accompanying drawings, in which.

4

DETAILED DESCRIPTION OF THE DRAWINGS

The present invention discloses a method and apparatus for encoding quantum data in a decoherence-resistant manner. A unique decoding scheme enables the original quantum data to be recovered in the event of decoherence or in the process of checking for decoherence. As is understood by those skilled in the art, one of the main difficulties when performing quantum computations in a quantum computer is that decoherence, caused by exposure of the data to the computing environment, destroys the stored information in a superposition of states, thus making long computations impossible. A conventional assumption has been that once one qubit has decohered, the entire computation of the quantum computer is corrupted, and the result of the computation will no longer be correct. The present invention illustrates that this may be too conservative of an assumption.

The classical analog of the decoherence problem is a situation in which bits of information are transmitted over a noisy channel such that the bits of information are corrupted during transmission. In such a situation, error correcting coders may advantageously be used to transmit additional bits which additional bits are used to recover, with a given error rate, the bits of information from the received corrupted bits.

One example of an error correcting coder is a repetition coder. In one example of such a coder, each single bit of information is transmitted over the noisy channel three times, e.g. a "1" bit is transmitted as a sequence "1 1 1." The transmitted sequence of bits will be corrupted on the noisy channel, and thus a received sequence of bits may be, for the same example, "1 0 1." The determination of whether a "1" or a "0" bit was transmitted originally will be made by a repetition decoder. The repetition decoder will select as the bit transmitted the binary digit that appears at least twice in the sequence of received bits, i.e. a "1" will be selected since it appeared twice in the received sequence in the example. Repetition coders are a subset of a type of coder known as a block encoder. An (n,k) block coder takes a block or sequence of k information bits and adds n−k additional bits in accordance with a prescribed encoding rule to form a block of n encoded bits. The block of n encoded bits (n=k+(n−k)) is then transmitted over the noisy channel. The code rate R is defined as k/n. A received block of n corrupted bits is used to make an estimate of the k information bits.

Block codes are memoryless in that each block of n encoded bits depends only on the k information bits. In contrast, other types of coders, i.e., convolutional coders, generate a block of n encoded bits based not only on the k information bits, but also on previously encoded groups of k information bits. Additional error correcting capability may be obtained by concatenating coders, e.g., by placing a first or outer coder in series with a second or inner coder. Error correcting coders are described in more detail in S. Lin and D. J. Costello, *Error Control Coding*, Prentice Hall, Englewood Cliffs, N.J. 1983.

Using a quantum analog to classical error correcting codes, the present invention illustrates how to store an arbitrary state of n qubits using expanded groupings of these n qubits in a decoherence-resistant way. Each qubit of the original n qubits is mapped into a grouping of qubits, and the process will reconstruct the original superposition simultaneously correcting both bit and phase errors if at most one qubit decoheres in each of these groups of qubits. Thus, even if one of the qubits decoheres, the original superposition can be reconstructed perfectly.

Figure 1:
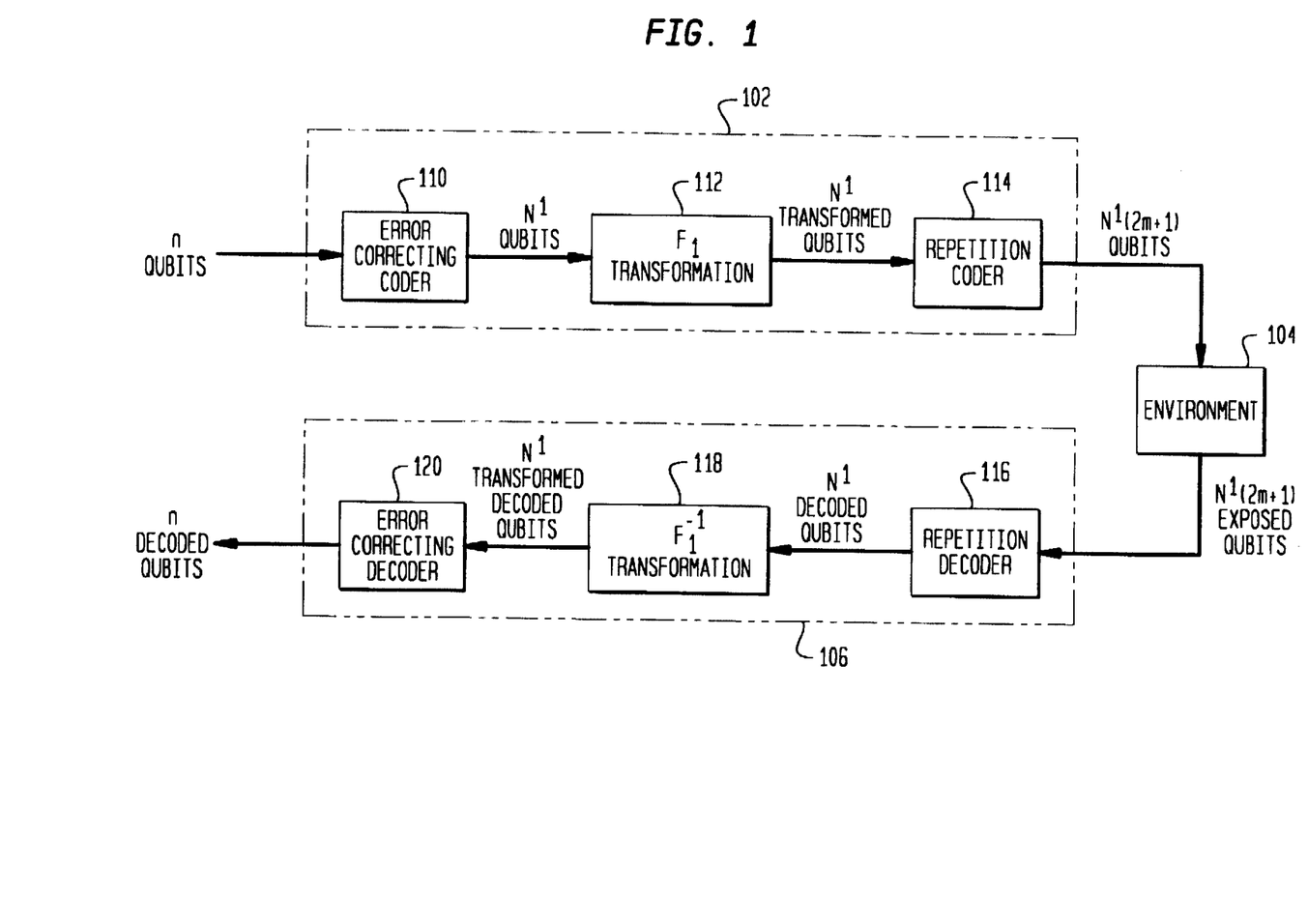
FIG. 1 shows one preferred embodiment of an encoder\decoder implemented in accordance with the present invention.

Referring to FIG. 1, there is shown a generalized block diagram representing one preferred embodiment of the present invention scheme for encoding\decoding quantum data in a quantum computational device. As can be seen, n qubits of quantum data are input to an encoder 102 which expands and transforms the quantum data according to predetermined quantum logic operations. The encoded data is then exposed to the environment 104 within the quantum computer, for example, during computations, wherein the data may be subjected to decoherence as a result of certain corrupting factors within the environment, e.g., certain types of noise. The exposed data, after being subject to the environment 104, may be recovered through a decoding process in which inverse operations from that of the encoding process are performed in a decoder 106.

In the shown embodiment of FIG. 1, n qubits are input to an error correcting coder 110 resulting in an expansion of N' qubits. The N' qubits are then input to a unitary quantum transformation 112 represented herein as $F_1$, wherein $F_1$ will be defined more specifically herein. The N' transformed qubits output as a result of the unitary transformation are next input to a repetition coder 114 which produces a further expanded N'(2m+1) qubits. As will be explained, the error correcting coder 110 and the repetition coder 114 are used to correct phase errors and bit errors, respectively, in the encoded quantum data.

As mentioned, the expanded N'(2m+1) qubits are then exposed to the environment 104 through a variety of manners during which the data may undergo possible corrupting decoherence. In order to recover the original quantum data subsequent to the exposure, the exposed qubits are subject to a repetition decoder 116 which decodes the exposed qubits back into the set of N' decoded qubits. The N' decoded qubits are then subject to an inverse transformation of $F_1^{-1}$ 118 which renders N' transformed decoded qubits. As a final step in the process, the N' transformed decoded qubits are input to an error correcting decoder 120, the output of which returns n decoded qubits, which subject to the discussion within is representative of the original n qubits. As would be understood, the error correcting coder and the repetition coder may use any of a number of coding algorithms including, for example, Hamming, Reed-Solomon, Goppa, Reed-Muller and Self-Dual error correcting codes.

Up until now it was not understood how to simultaneously correct for both bit errors, e.g., in which a |0> becomes a |1>, and phase errors, e.g., errors in which the state $1/\sqrt{2}(|0>+|1>)$ becomes $1/\sqrt{2}(|0>-|1>)$, in stored quantum data. Accordingly, doubt always remained about error introduced in an only partially corrected result. The present invention utilizes the error correcting encoder/decoder in the outer layer to correct phase errors and the repetition coder/decoder in the inner layer to correct bit errors. As would be understood, however, the outer layer may also be used to correct bit errors and the inner layer used to correct phase errors.

In the present invention model of quantum computation, a gate array model using quantum logic gates, it is assumed that there are s qubits. These qubits start in some specified initial configuration, which may be taken to be |0,0,0,. . . . 0>. They are then acted on by a sequence of measurement and entanglement operations, which manipulate the state of these s qubits in a corresponding $2_s$-dimensional Hilbert space.

In the measurement operation, one qubit is measured in some basis, for example a Bell basis, and the result is recorded classically. This corresponds to a projection operation in the Hilbert space. With entanglement, as would be understood, two qubits are entangled according to some four by four unitary matrix. The corresponding Hilbert space operation describing the entire s qubits is a tensor product of this four by four unitary matrix with the $2^{s-2}$ by $2^{s-2}$ identity matrix. Entanglements of three or more qubits can always be accomplished by a sequence of two-bit entanglements. The result of a computation is extracted from the computer by measuring the values of the qubits.

The computer must also be initialized by putting its memory in some known state. This could be done by postulating a separate operation, for example, an initialization, which sets a qubit to a predetermined value. A qubit can also be initialized by first measuring it and then performing a rotation to put it in the proper state, wherein rotations are a special case of the entanglement operation—even though there is no actual entanglement of different qubits taking place.

Subsequent to an initialization operation as described above, an encoding operation is performed as a next step in the present invention method. Suppose there are k qubits that are to be stored. In one preferred embodiment of the present invention, the quantum computer expands and encodes each of these qubits into nine qubits as follows, thereby providing a degree of redundancy, as will be discussed:

$$|0> \rightarrow \frac{1}{2\sqrt{2}} (|000> + |111>)(|000> + \qquad (1.1)$$

$$|111>)(|000> + |111>$$

$$|1> \rightarrow \frac{1}{2\sqrt{2}} (|000> - |111>)(|000> -$$

$$|111>)(|000> - |111>)$$

Figure 2:
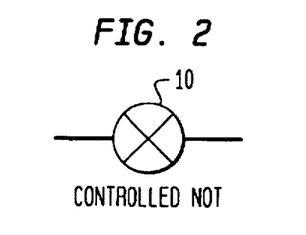
FIG. 2 shows an exemplary representation of a quantum Controlled NOT gate.

In order to accomplish the encoding for equation 1.1, three kinds of quantum gates are necessary for the exemplary encoding (and decoding) method described. Referring to FIG. 2, a first gate is a controlled NOT 10, represented by the matrix:

$$\begin{pmatrix} 1000 \\ 0100 \\ 0001 \\ 0010 \end{pmatrix} \qquad (2.1)$$

The controlled NOT gate 10 takes two qubits and negates the second (the target qubit) if the first qubit (the control qubit) is 1, while leaving the target qubit unchanged if the control qubit is 0.

A next quantum gate which is needed operates on only one qubit and is represented by the matrix:

$$\frac{1}{\sqrt{2}} \begin{pmatrix} 1 & 1 \\ 1 & -1 \end{pmatrix} \qquad (2.2)$$

Figure 2A:
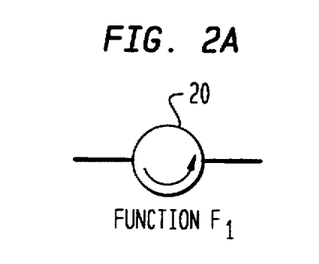
FIG. 2A shows an exemplary representation of a quantum gate for an operation defined as $F_1$. (Function 1)

This matrix will be represented as (function) $F_1$, wherein the $F_1$, gate 20 will be represented as shown in FIG. 2A. The $F_1$ gate 20 takes the basis states |0> and |1> to the superpositions $$\frac{1}{\sqrt{2}} (|0\rangle + |1\rangle \text{ and } \frac{1}{\sqrt{2}} (|0\rangle - |1\rangle,$$

respectively. It also takes the superposition $$\frac{1}{\sqrt{2}} (|0\rangle + |1\rangle \text{ to } |0\rangle$$

and the superposition $$\frac{1}{\sqrt{2}} (|0\rangle - |1\rangle \text{ to } |1\rangle,$$

so applying it twice gives the identity. The above-defined function $F_1$. is a specific case of a more general transformation comprising any 2×2 unitary matrix whose entries all have an equal absolute value. The more general transformation may be represented as follows:

$$\frac{1}{\sqrt{2}} \begin{pmatrix} e^{i\theta_1} & e^{i\theta_2} \\ e^{i\theta_3} & -e^{i(\theta_3+\theta_2-\theta_1)} \end{pmatrix}$$

where $i=\sqrt{-1}$ and $\theta_1$, $\theta_2$ and $\theta_3$ are between 0 and $2\pi$.

Figure 3:
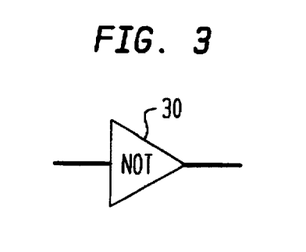
FIG. 3 shows an exemplary representation for a NOT gate.

The final gate or transformation needed is a NOT gate 30, shown in FIG. 3. which is represented by $$\begin{pmatrix} 0 & 1 \\ 1 & 0 \end{pmatrix} \quad (2.3)$$

in matrix form and which takes the basis state $|0\rangle$ to $|1\rangle$ and the state $|1\rangle$ to $|0\rangle$.

Figure 4A:
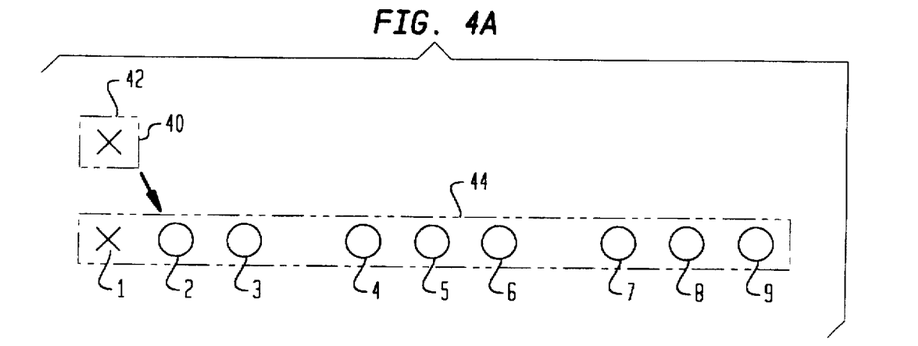
FIGS. 4A–D show an exemplary illustration for an encoding scheme performed on 9n qubits of data.
Figure 4B:
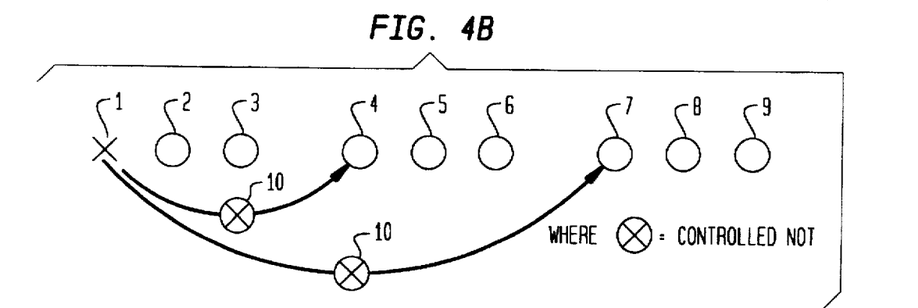

In order to accomplish the encoding, as shown in FIG. 4A, a qubit 40 in a memory cell 42 is expanded to nine qubits 1–9 in a second memory cell 44, with a first qubit 1 in the desired quantum state to be encoded and the rest in the state $|0\rangle$. Utilizing the logic operations defined in FIGS. 2, 2A and 3, two controlled NOT operations 10 are then applied with the first qubit 1 as the control qubit and the fourth and seventh qubits 4,7 as the target qubits. If the first qubit 1 started in state $a|0\rangle$ to $b|1\rangle$, this gives the state $a|0_1 0_4 0_7\rangle + b|1_1 1_4 1_7\rangle$ as shown in FIG. 4B. The above operations correspond to a simplified example of the n qubits being input to an error correcting coder to realize the N' encoded qubits.

Figure 4C:
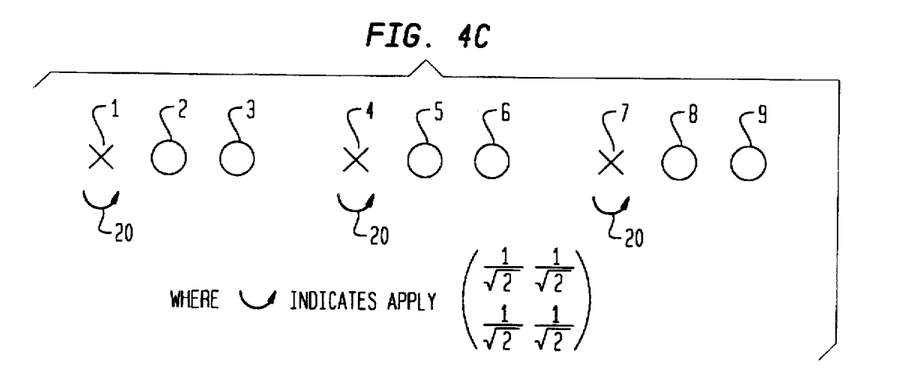

Next, the operation $F_1$, 20 is applied to the first, fourth and seventh qubits 1,4,7, as shown in FIG. 4C. This produces the state $$\frac{b}{2\sqrt{2}} (|0_1\rangle + |1_1\rangle)(|0_4\rangle + |1_4\rangle)(|0_7\rangle + |1_7\rangle) +$$

$$\frac{c}{2\sqrt{2}} (|0_1\rangle - |1_1\rangle)(|0_4\rangle - |1_4\rangle)(|0_7\rangle - 1_7\rangle).$$

Figure 4D:
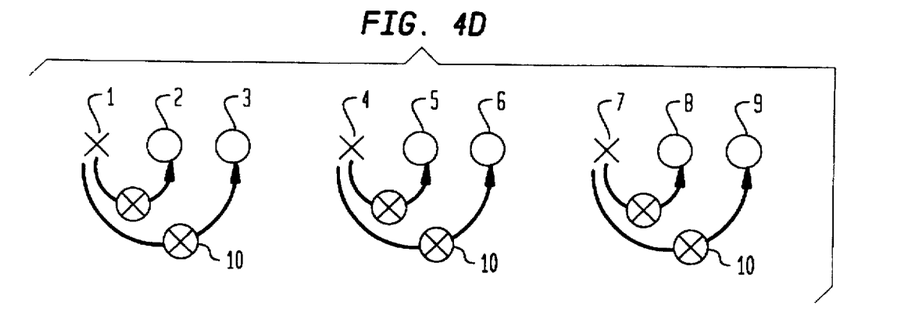

Referring to FIG. 4D, six controlled NOTs 10 are applied, with the first qubit 1 as the control and the second qubit 2 as target, the first qubit 1 as control and third qubit 3 as target, fourth qubit 4 as control and fifth qubit 5 as target, fourth qubit 4 as control and sixth qubit 6 as target, seventh qubit 7 as control and eighth qubit 8 as target, and seventh qubit 7 as control and ninth qubit 9 as target. This produces the state $$\frac{b}{2\sqrt{2}} (|0_1 0_2 0_3\rangle + |1_1 1_2 1_3\rangle)(|0_4 0_5 0_6\rangle +$$

$$|1_4 1_5 1_6\rangle)(|0_7 0_8 0_9\rangle + |1_7 1_8 1_9\rangle) +$$

$$\frac{c}{2\sqrt{2}} (|0_1 0_2 0_3\rangle - |1_1 1_2 1_3\rangle)(|0_4 0_5 0_6\rangle -$$

$$|1_4 1_5 1_6\rangle)(|0_7 0_8 0_9\rangle - |1_7 1_8 1_9\rangle),$$

which is the desired encoding of the state of the first qubit as shown in equation 1.1. The effect of the operations performed in FIG. 4D correspond effectively to that of inputting the N' transformed qubits to a simplified repetition coder. It will be understood that the encoding illustrated in FIG. 4 is merely an exemplary representation of that used to reach equation 1.1 and that the encoding may be performed in a variety of manners as would be understood by one skilled in the art.

Now consider what happens when the nine qubits 1–9 containing the encoding are read. These qubits are actually read in a quantum fashion using an ancilla (of extra qubits), that is, by entangling the nine qubits 1–9 with other qubits, as discussed above, and then measuring some of these other qubits. The qubits 1–9, however, are not measured directly.

For explanatory purposes, it is best to first consider what happens if the qubits are measured using a Bell basis. This same basis will later be used to "read" the qubits by entangling them with qubits that will then be measured. Suppose that no decoherence has occurred, and that the first three qubits 1–3 are in state $|000\rangle+|111\rangle$. This then means that the other two sets of qubits 4–6, 7–9 are also in state $|000\rangle+|111\rangle$, since there has been no decoherence. Similarly, if the first three qubits 1–3 are in state $|000\rangle-|111\rangle$, the other two sets or triples 4–6, 6–9 must also be in this state. Thus, even if one qubit has decohered, when the nine qubits are measured (measuring each triple in the Bell basis $|000\rangle\pm|111\rangle$, $|001\rangle\pm|110\rangle$, $|010\rangle\pm|101\rangle$, $|100\rangle\pm|011\rangle$) it can be deduced what the measurement should have been by taking a majority of the three triples, and thus we can tell whether the encoded bit was a 0 or a 1.

This, however, does not let the first qubit 1 be restored to any superposition or entanglement that it may have been in, because measuring the nine qubits 1–9 will be, in effect, projecting all the qubits onto a subspace. This process also projects the original encoded bit onto a subspace, and so does not let us recover a superposition of an encoded 0 and an encoded 1.

To preserve the state of superposition of the encoded qubit 40, what is done is, in effect, to measure the decoherence without measuring the state of the qubits. This allows the decoherence, in effect, to be reversed. To explain in detail, the decoherence process must first be examined more fully. A critical assumption here is that decoherence only affects one qubit of the superposition, while the other qubits remain unchanged. It is not clear how reasonable this assumption is physically, but it corresponds to the assumption in classical information theory of independence of noise.

By quantum mechanics, decoherence must be a unitary process (where all probabilities add to one) which entangles a qubit with the environment. The decoherence process can be explained by specifying what happens to two basis states of the qubit undergoing decoherence, $|0\rangle$ and $|1\rangle$. Considering the environment as well, these basis states must be taken to orthogonal states in quantum vector space, but if the environment is neglected, they can get taken to any combination of states.

It will now be described more precisely what happens to the qubit that decoheres. It is assumed that this is the first qubit 1 in the encoding, but as would be understood, the procedure works equally well if any of the other eight qubits is the one that decoheres. Because $|0\rangle$ and $|1\rangle$ form a basis for the first qubit 1, it need only be considered what happens to these two states. In general, the decoherence process must be:

$$|e_0\rangle|0\rangle \rightarrow |a_0\rangle|0\rangle + |a_1\rangle|1\rangle \quad (1.2)$$

$$|e_0\rangle|1\rangle \rightarrow |a_2\rangle|0\rangle + |a_3\rangle|1\rangle$$

where $|e_0\rangle$ is the initial state of the environment and $|a_0\rangle, |a_1\rangle, |a_2\rangle$, and $|a_3\rangle$ are states of the environment (not generally orthogonal or normalized). Let us now see what happens to an encoded 0, that is, to the superposition $(1/\sqrt{2})(|000\rangle + |111\rangle)$. After decoherence and a breakout of the first three qubits, the expression goes to the superposition $$(1/\sqrt{2}) \left[ (|a_0\rangle|0\rangle + |a_1\rangle|1\rangle)|00\rangle + \right. \quad (1.3)$$

$$\left. (|a_2\rangle|0\rangle + |a_3\rangle|1\rangle)|11\rangle \right].$$

As would be understood, by one skilled in the art, equation 1.3 can be written in terms of a Bell basis, obtaining $$\frac{1}{2\sqrt{2}} (|a_0\rangle + |a_3\rangle)(|000\rangle + |111\rangle) + \quad (1.4)$$

$$\frac{1}{2\sqrt{2}} (|a_0\rangle - |a_3\rangle)(|000\rangle - |111\rangle) +$$

$$\frac{1}{2\sqrt{2}} (|a_1\rangle + |a_2\rangle)(|100\rangle + |011\rangle) +$$

$$\frac{1}{2\sqrt{2}} (|a_1\rangle - |a_2\rangle)(|100\rangle - |011\rangle).$$

Similarly, the vector $|000\rangle - |111\rangle$ for an encoded 1 goes to $$\frac{1}{2\sqrt{2}} (|a_0\rangle + |a_3\rangle)(|000\rangle - |111\rangle) + \quad (1.5)$$

$$\frac{1}{2\sqrt{2}} (|a_0\rangle - |a_3\rangle)(|000\rangle + |111\rangle) +$$

$$\frac{1}{2\sqrt{2}} (|a_1\rangle + |a_2\rangle)(|100\rangle - |011\rangle) +$$

$$\frac{1}{2\sqrt{2}} (|a_1\rangle - |a_2\rangle)(|100\rangle + |011\rangle)$$

The important thing to note is that the state of the environment $(|a_0\rangle \pm |a_3\rangle)$ or $(|a_1\rangle \pm |a_2\rangle)$ is the same for corresponding vectors from the decoherence of the two quantum states encoding 0 and encoding 1. Further, it is known what the original state of the encoded vector was by looking at the other two triples. Thus, the original state of the encoded vector can be restored and also the evolution can be kept unitary by creating a few ancillary qubits which tell which qubit decohered and whether the sign on the Bell superposition changed. By measuring these ancillary qubits, the original state can be restored. Any existing superposition of basis Bell states is still maintained because the coefficients are the same whether the original vector decohered from the state $|000\rangle + |111\rangle$ or $|000\rangle - |111\rangle$. By measuring the ancillary qubits that tell which qubit was decohered, in effect, the original state is restored.

Figure 5A:
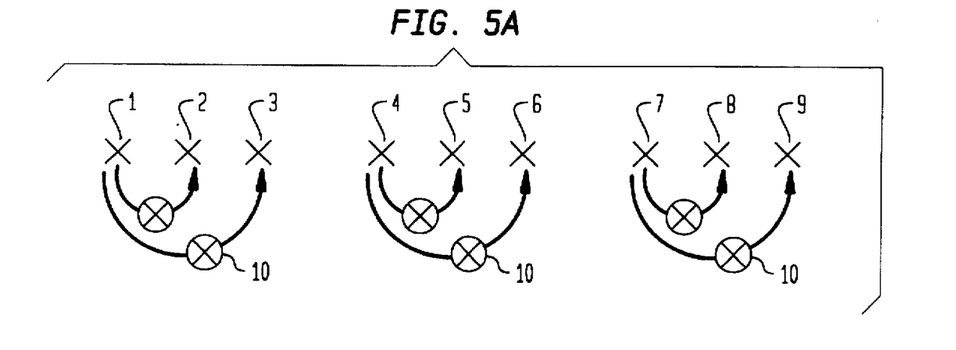
FIGS. 5A–G show an exemplary decoding scheme for the data of FIG. 4.
Figure 5B:
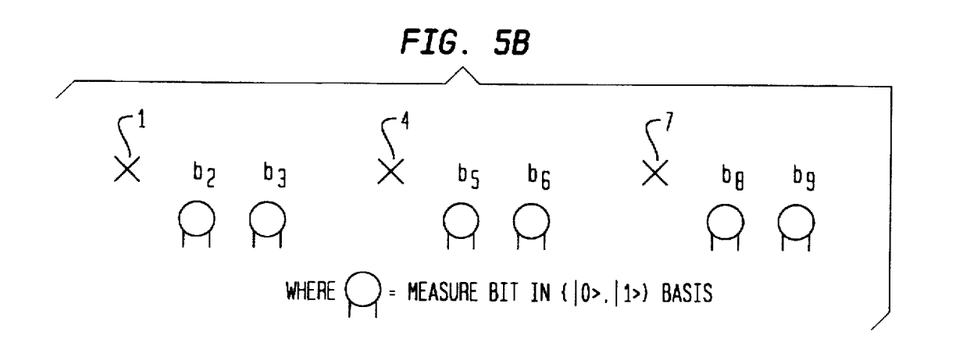

This restoration process is now described more fully with reference to the encoding example of FIG. 4. To decode, nearly the same algorithm is used in reverse, except that some steps need to be added to take care of any noise that was introduced. Again, we start with a state of the nine encoded qubits 1–9 from FIG. 4. This gives the state $$\frac{b}{2\sqrt{2}} (|0_1 0_2 0_3\rangle + |1_1 1_2 1_3\rangle)(|0_4 0_5 0_6\rangle +$$

$$|1_4 1_5 1_6\rangle)(|0_7 0_8 0_9\rangle + |1_7 1_8 1_9\rangle) +$$

$$\frac{c}{2\sqrt{2}} (|0_1 0_2 0_3\rangle - |1_1 1_2 1_3\rangle)(|0_4 0_5 0_6\rangle -$$

$$|1_4 1_5 1_6\rangle)(|0_7 0_8 0_9\rangle - |1_7 1_8 1_9\rangle),$$

except that it is assumed that one of these qubits might have decohered. First, referring to FIG. 5A, six controlled NOTs are applied using the first qubit 1 as the control and the second qubit 2 as target, the first qubit 1 as control and the third 3 as target, the fourth qubit 4 as control and the fifth 5 as target, fourth 4 as control and sixth 6 as target, seventh 7 as control and eighth 8 as target, and seventh 7 as control and ninth 9 as target. This undoes the encoding done in FIG. 4D. If no qubits have decohered, then the measurements of the second, third, fifth, sixth, eighth and ninth qubits will result in 0, as shown in FIG. 5B. Thus, if any of these measurements are 1, it will be known that some of these qubits decohered. If only one of these measurements is 1, and only one qubit decohered, then we will know that the measured qubit is the one that is decohered, and it can be ignored. If both the ith and the (i+1)st qubits are 1, where i=2,5 or 8, then it can be deduced that the (i−1)st qubit is the one that decohered, and it can be negated, i.e., apply the transformation to restore the qubit to the desired state. (FIG. 5C) The step performed in FIG. 5C corrects any bit errors, where a bit error is defined as exchanging the states $|0\rangle$ and $|1\rangle$.

Figure 5C:
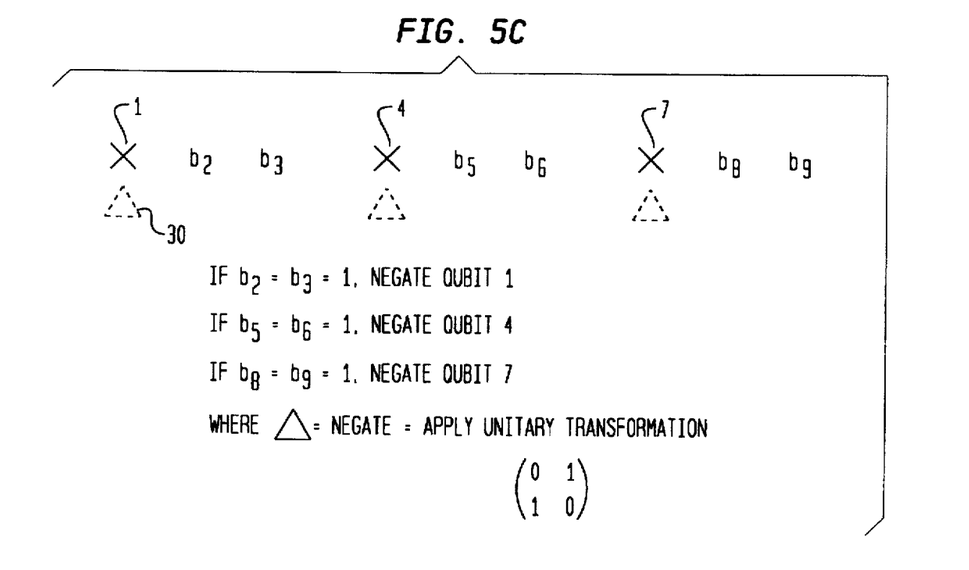
Figure 5D:
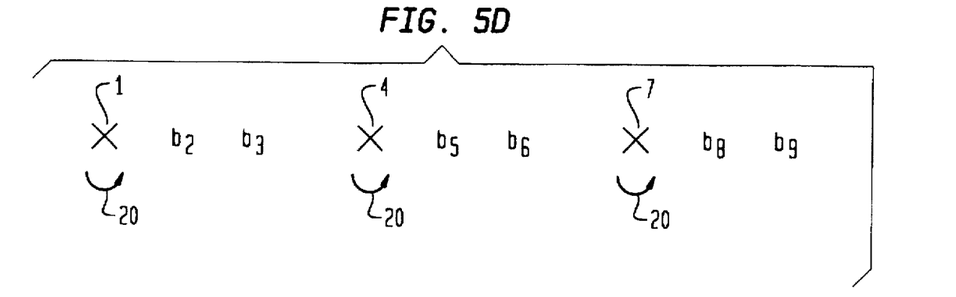
Figure 5E:
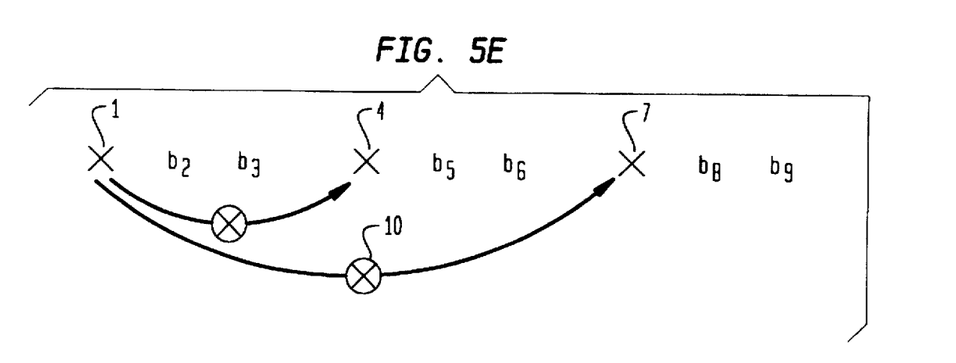
Figure 5F:
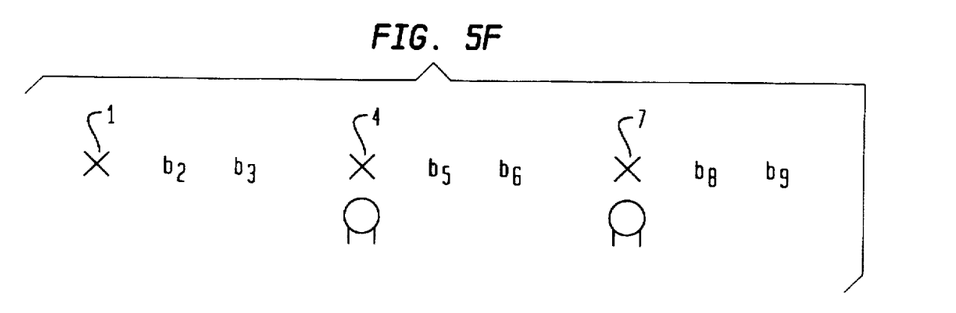
Figure 5G:
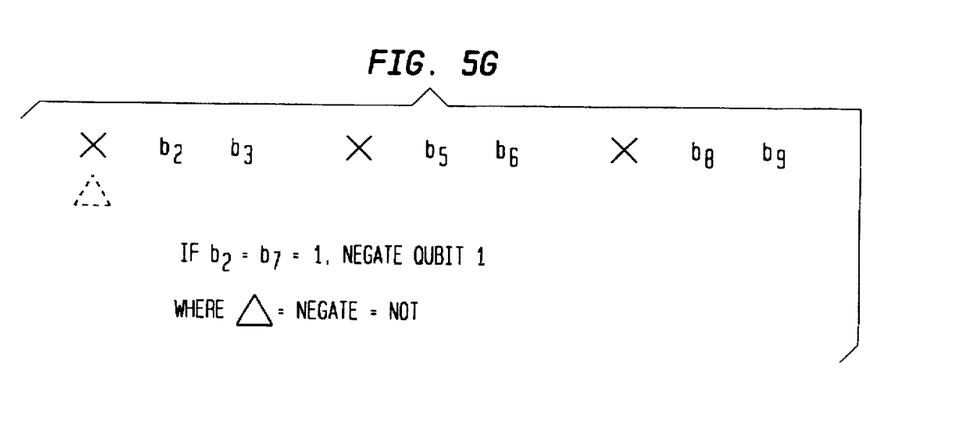

Next, referring to FIG. 5D, the matrix $F_1$, is applied to the first, fourth and seventh qubits, as was done in FIG. 4C. If no qubits have decohered, this undoes step 4B. Step 4A is then undone by applying two controlled NOTs with qubit 1 as the control and qubits 4 and 7 as target, as shown in FIG. 5E. Finally, the fourth and seventh qubits are measured, as shown in FIG. 5F. This step will detect phase errors in the qubits of the encoding, which correspond to negation errors in the state of the encoded qubit. If exactly one of them is 0 and one is 1, it is known the qubit which was 1 underwent decoherence, but the state of the decoded qubit is still accurate. If both the fourth and seventh qubits are measured to be 1, we then need to apply a quantum NOT to the original qubit to restore the pre-coding state, as shown in FIG. 5G. The step performed in FIG. 5G corrects any phases in the present data, where a phase error exchanges the states $1/\sqrt{2}(|0\rangle + |1\rangle)$ and $1/\sqrt{2}(|0\rangle - |1\rangle)$.

Let us again track what happens if one of the qubits decoheres. In this example, the third qubit will be used; the analysis of the other qubits, as before, is similar. Suppose the state of the third qubits is changed as follows:

$$|0_3\rangle \rightarrow |e_0\rangle|0_3\rangle + |e_1\rangle|1_3\rangle$$

$$|1_3\rangle \rightarrow |e_2\rangle|0_3\rangle + |e_3\rangle|1_3\rangle$$

where the states $|e_i\rangle$ are various non-normalized states of the environment. From above, we then start with the state $$\frac{b}{2\sqrt{2}} (|e_0\rangle|0_1 0_2 0_3\rangle + |e_1\rangle|0_1 0_2 1_3\rangle +$$

-continued $$|e_2\rangle|1_11_20_3\rangle + |e_3\rangle|1_11_21_3\rangle)(|0_40_50_6\rangle +$$

$$|1_41_51_6\rangle)(|0_70_80_9\rangle + |1_71_81_9\rangle) +$$

$$\frac{c}{2\sqrt{2}} (|e_0\rangle|0_10_20_3\rangle + |e_1\rangle|0_10_21_3\rangle -$$

$$|e_2\rangle|1_11_20_3\rangle - |e_3\rangle|1_11_21_3\rangle)(|0_40_50_6\rangle -$$

$$|1_41_51_6\rangle)(|0_70_80_9\rangle - |1_71_81_9\rangle),$$

After the first decoding step (FIG. 5A), the state becomes $$\frac{b}{2\sqrt{2}} (e_0\rangle|0_10_20_3\rangle + |e_1\rangle|0_10_21_3\rangle + |e_2\rangle|1_10_21_3\rangle +$$

$$|e_3\rangle|1_10_20_3\rangle)(|0_4\rangle + |1_4\rangle)|0_50_6\rangle)(|0_7\rangle + |1_7\rangle)|0_80_9\rangle +$$

$$\frac{c}{2\sqrt{2}} (|e_0\rangle|0_10_20_3\rangle + |e_1\rangle|0_10_21_3\rangle - |e_2\rangle|1_10_21_3\rangle -$$

$$|e_3\rangle|1_10_20_3\rangle)(|0_4\rangle - |1_4\rangle)|0_50_6\rangle)(|0_7\rangle - |1_7\rangle)|0_80_9\rangle,$$

Now, in the subsequent measurement step (FIG. 5B), qubits 2,5,6,7 and 8 will be measured as 0, but qubit 3 may be measured as either 0 or 1. It will be measured as 0 with probability proportional to $||e_1\rangle+|e_2\rangle|^2$ and as 1 with probability proportional to $||e_1\rangle-|e_2\rangle|^2$. Let us assume qubit 3 is measured as 1. The subsequent state (including the environment) will be:

$$\frac{b}{2\sqrt{2}} (|e_1\rangle|0_10_21_3\rangle + |e_2\rangle|1_10_21_3\rangle)(|0_4\rangle +$$

$$|1_4\rangle)|0_50_6\rangle)(|0_7\rangle + |1_7\rangle)|0_80_9\rangle +$$

$$\frac{c}{2\sqrt{2}} |e_1\rangle|0_10_21_3\rangle - |e_2\rangle|1_10_21_3\rangle)(|0_4\rangle -$$

$$|1_4\rangle)|0_50_6\rangle)(|0_7\rangle - |1_7\rangle)|0_80_9\rangle,$$

It will be understood that the following analysis is analogous when qubit 3 is measured as 0. In any event, since qubits 2 and 3 are not both 1, nothing is done to the first qubit in step 5C. The states of qubits 2,3,5,6,8 and 9 will now be ignored as they play no further role in the algorithm. Concentrating then only on qubits 1,4, and 7, we have the state $$\frac{b}{2} [(|e_1\rangle + |e_2\rangle)|0_10_40_7\rangle + (|e_1\rangle - |e_2\rangle)|1_10_40_7\rangle] +$$

$$\frac{c}{2} [>|e_1\rangle - |e_2\rangle)|0_11_41_7\rangle + (|e_1\rangle + |e_2\rangle)(|1_11_41_7\rangle)].$$

After applying $F_1$, to qubits 1, 4, and 7, as shown in FIG. 5D, the following is obtained:

$$\frac{b}{2\sqrt{2}} (|e_1\rangle|0_1\rangle + |e_2\rangle|1_1\rangle)(|0_4\rangle + |1_4\rangle)(|0_7\rangle + |1_7\rangle) +$$

$$\frac{c}{2\sqrt{2}} |e_1\rangle|0_1\rangle - |e_2\rangle|1_1\rangle)(|0_4\rangle - |1_4\rangle)(|0_7\rangle - |1_7\rangle)$$

which can be rewritten as $$\frac{b}{2} [|e_1\rangle(|0_1\rangle + |1_1\rangle) + |e_2\rangle(|0_1\rangle - |1_1\rangle)]|0_40_7\rangle +$$

$$\frac{c}{2} [|e_1\rangle(|0_1\rangle + |1_1\rangle) - |e_2\rangle(|0_1\rangle - |1_1\rangle)]|1_41_7\rangle$$

Now, after two controlled NOTs are applied on the first and fourth qubits 1,4 and on the first and seventh qubits 1,7 (FIG. 5E) the state is left as $$\frac{b}{2} [(|e_1\rangle + |e_2\rangle)|0_10_40_7\rangle + (|e_1\rangle - |e_2\rangle)|1_11_41_7\rangle] +$$

$$\frac{c}{2} [(|e_1\rangle - |e_2\rangle)|0_11_41_7\rangle + (|e_1\rangle + |e_2\rangle)(|1_10_40_7\rangle)].$$

With probability $||e_1\rangle+|e_2\rangle|^2$, the fourth and seventh qubits 4,7 will be measured as 0, and with probability $||e_1\rangle-|e_2\rangle|^2$, they both will be measured both as 1 (FIG. 5F). In the first case, we are left with the state $$\frac{1}{2}(|e_1\rangle+|e_2\rangle)(|0_1\rangle+c|1_1\rangle)|0_40_7\rangle,$$

in which the first qubit is returned to the original state. In the second case, we are left with the state $$\frac{1}{2}(|e_1\rangle-|e_2\rangle)(b|1_1\rangle+c|0_1\rangle)|1_41_7\rangle,$$

which becomes the original state after a NOT is applied to the first qubit as in FIG. 5G.

This restoration can thus be considered to consist first of a unitary transformation which can be regarded as being performed by a quantum computer, and then a measurement of some of the qubits of the outcome. What the computer first does is compare all three triples of the nine qubit expansion in the Bell basis. If these triples are the same, the computer outputs "no decoherence" (in the ancillary encoded qubits) and leaves the encoded qubits alone.

If these triples are not the same, the computer outputs which triple is different, and how it is different. The computer must then restore the encoded qubits to their original state. For example, in Equations (1.4) and (1.5), the output corresponding to the second line of the expression would mean "wrong sign (phase error)", the output corresponding to the third line would mean "first qubit wrong, but right sign (bit error)", and the output corresponding to the fourth line would mean "phase error and bit error". These outputs are expressed by some quantum state of the ancilla which then is measured. Because the coefficients on the corresponding vectors in Equations (1.4) and (1.5) are the same, the superposition of states after the measurement and the subsequent corrections will be the same as the original superposition of states before the decoherence. Further, the correction of errors is now a unitary transformation because the error is not just being corrected, but also "measured", in that we measure what and where the error was, so we do not have to combine two quantum states into one. As would be understood with respect to the above discussion, an indication of "ith qubit wrong" indicates there was a bit error in the specific qubit and "sign wrong" indicates a phase error.

If more than one qubit of a nine-tuple decoheres, the encoding scheme does not work. However, the probability that this happens is proportional to the square of the probability that one qubit decoheres. That is, if each qubit decoheres with a probability p, then the probability the k qubits do not decohere is probability $(1-p)^k$. In present invention encoding scheme, each qubit is replaced by nine. The probability that at least two qubits in any particular nine-tuple decohere is $1-(1+8p)(1-p)^8 \approx 36p^2$, and the probability that our 9k qubits can be decoded to give the original quantum state is approximately $(1-36p^2)^k$. Thus, for a probability of decoherence less than 1/36, we have an improved storage method for quantum coherent states of large numbers of qubits. Since p generally increases with storage time a watchdog effect could be used to store quantum information over long periods by using the decoherence restoration scheme to frequently reset the quantum state. If the decoherence time for a qubit is $t_d$, the above analysis implies that use of the watchdog effect will be advantageous if the quantum state is reset at time intervals It seems that something is being received for nothing, in that the state of the superposition is being restored to the exact original pre-decoherence state, even though some of the information was destroyed. The reason this can be done is that one qubit is expanded to nine encoded qubits, providing some sort of redundancy. Our encoding scheme stores information in the entanglement between qubits, so that no information is stored in any one specific qubit; i.e., measuring any one of the qubits gives no information about the encoded state. Essentially, what the present invention is doing is putting all of the information in a signal into dimensions of a signal space that are unlikely to be affected by decoherence. The effect of the decoherence can then be measured in the other dimensions of this space, which contain no information about the signal, and this measurement is used to restore the original signal.

There is a cost for using this scheme. First, the number of qubits is expanded from k to 9k. Second, the machinery that implements the unitary transformations will not be exact. Thus, getting rid of the decoherence will introduce a small extra amount of error. This may cause problems if it is wished to store quantum information for long periods of time by repeatedly using this decoherence reduction technique. If the unitary transformations were perfect, the information could be kept for large times using a watchdog effect by repeatedly measuring the state to eliminate the decoherence. However, each time we get rid of the decoherence (or even check whether there was decoherence) a small extra amount of error is introduced. Therefore, a rate must be chosen at which the state is measured so as to balance the error introduced by decoherence with the error introduced by the restoration of decoherence.

The assumption that the qubits decohere independently is crucial. This is not completely unreasonable physically, and may in many cases be a good approximation of reality, but the effects of changing this assumption on the accuracy of the encoding must be investigated. This assumption corresponds to independence of errors between different bits in classical information theory; even though this doesn't always hold in practice for classical channels, classical error-correcting codes can still be made to work very well. This is done by exploiting the fact that errors in bits far enough apart from each other are, in fact, nearly independent. It is not clear what the corresponding property would be in a quantum channel, or whether it would hold in practice.

It would be understood that there are improvements or adjustments that can be made to the above scheme. What this scheme does is use a three-repetition code twice; once in an outer layer (repeating the triple of qubits three times) and once in an inner layer (using |000>±|111> for each triple). In classical information theory, repetition codes are extremely inefficient. The outer layer of our quantum code can be replaced by a classical error-correcting code to produce a more efficient scheme; this reduces the cost of encoding k qubits from 9k qubits to a function that approaches 3k qubits asymptotically as k grows. The inner layer of the quantum code, however, needs to have more properties than a classical error-correcting code because it needs to be able to correct errors coherently. Longer repetition codes can be used for this inner layer to correct decoherence in more than one qubit. In any event, the present invention is a step toward the quantum analog of channel coding in classical information theory.

From the above, it should be understood that the embodiments described, in regard to the drawings, are merely exemplary and that a person skilled in the art may make variations and modifications to the shown embodiments without departing from the spirit and scope of the invention. All such variations and modifications are intended to be included within the scope of the invention as defined in the appended claims.

What is claimed is:

1. A method of decoding a set of N'(2m+1) qubits, said set of N'(2m+1) exposed qubits having undergone possible decoherence from a superposition of states due to exposure to an environment, said method comprising the steps of:

decoding said set of N'(2m+1) exposed qubits using a repetition decoder to yield a set of N' decoded qubits, applying a first transformation to each decoded qubit in said set of said N' decoded qubits to yield a set of N' transformed decoded qubits, wherein said first transformation is represented as a unitary matrix comprising matrix entries of equal absolute value, and decoding said set of N' transformed decoded qubits using an error correcting decoder to yield a set of n decoded qubits.

2. The method of claim 1, wherein said set of N'(2m+1) exposed qubits was generated by exposing a set of N'(2m+1) qubits to said environment.

3. The method of claim 2, wherein said set of N'(2m+1) qubits was generated by the steps of:

encoding a set of n qubits using an error correcting coder to yield a set of N' qubits, wherein said error correcting coder is the inverse of said error correcting decoder, applying a second transformation to each qubit in said set of N' qubits to yield a set of N' transformed qubits, wherein said second transformation is the inverse of said first transformation, and encoding said set of N' transformed qubits using a repetition coder to yield said set of N'(2m+1) qubits, wherein said repetition coder is the inverse of said repetition decoder.

4. The method of claim 1, wherein said repetition decoder uses a repetition code of length 2m+1 in an inner layer to correct m bit errors.

5. The method of claim 1, wherein said error correcting decoder uses a repetition code of length 2L+1 in an outer layer to correct L phase errors.

6. The method of claim 1, wherein said error correcting decoder uses a repetition code with minimum Hamming distance 2t+1 in an outer layer to correct t phase errors.

7. The method of claim 1, wherein said transformation comprises a 2×2 unitary matrix having all entries with an equal absolute value.

8. The method of claim 7, wherein said transformation is represented by the matrix:

$$\frac{1}{\sqrt{2}} \begin{pmatrix} e^{i\theta_1} & e^{i\theta_2} \\ e^{i\theta_3} & -e^{i(\theta_3+\theta_2-\theta_1)} \end{pmatrix}$$

where $i=\sqrt{-1}$ and $\theta_1, \theta_2$ and $\theta_3$ are between 0 and $2\pi$.

9. A method comprising the steps of:

encoding a set of n qubits using an error correcting coder to yield a set of N' qubits, applying a first transformation to each qubit in said set of said N' qubits to yield a set of N' transformed qubits, wherein said first transformation is represented as a unitary matrix comprising matrix entries of equal absolute value, and encoding said set of N' transformed qubits using a repetition coder to yield a set of N'(2m+1) qubits.

10. The method of claim 9 wherein said set of N'(2m+1) qubits are exposed to an environment, said environment causing said set of N'(2m+1) qubits to undergo possible decoherence from a superposition of states due to exposure to said environment thereby yielding set of N'(2m+1) exposed qubits.

11. The method of claim 10 further comprising the steps of:

decoding said set of N'(2m+1) exposed qubits using a repetition decoder to yield a set of N' decoded qubits, wherein said repetition decoder is the inverse of said repetition encoder, applying a second transformation to each decoded qubit in said set of N' decoded qubits to yield a set of N' transformed decoded qubits, wherein said second transformation is the inverse of said first transformation, and decoding said set of N' transformed decoded qubits using an error correcting decoder to yield a set of n decoded qubits, wherein said error correcting coder is the inverse of said error correcting decoder.

12. A method of detecting decoherence in quantum data stored in a quantum computational device from a superposition of states, said method comprising the steps of:

providing n qubits for use in said quantum computational device, wherein n is a positive integer;

encoding said n qubits into an N' qubit expansion thereby introducing a redundancy factor, said expansion being accomplished according to a predetermined mapping of basis states, where N' is an integer greater than n; and comparing predetermined groupings for a specific expanded qubit of said expansion, wherein an identical value for all said predetermined groupings of said specific qubit is indicative that none of the N' qubits corresponding to said specific qubit has decohered.

13. The method of claim 12, further including the step of outputting a signal to said quantum computational device indicative of a non-decoherent condition for said quantum data, wherein said qubits corresponding to said specific qubit are left intact.

14. The method of claim 12, wherein N'=9, said predetermined basis is a Bell basis, and said encoding is represented by the expression:

$$|0\rangle \rightarrow \frac{1}{2\sqrt{2}} (|000\rangle + |111\rangle)(|000\rangle + |111\rangle)(|000\rangle + |111\rangle)$$

and $$|1\rangle \rightarrow \frac{1}{2\sqrt{2}} (|000\rangle - |111\rangle)(|000\rangle - |111\rangle)(|000\rangle - |111\rangle).$$

15. The method of claim 12, wherein N'=9 and a first expanded qubit for said N qubit expansion is in a desired quantum state for encoding and the remaining qubits are in a |0⟩) state, said step of encoding including the steps of:

applying two controlled NOT operations with said first of said nine expanded qubits as a control bit and a fourth and seventh qubits as target qubits;

performing function $F_1$, on a first, fourth and seventh qubit, wherein function $F_1$, is defined by the matrix $$\frac{1}{\sqrt{2}} \begin{pmatrix} 1 & 1 \\ 1 & -1 \end{pmatrix};$$

and executing controlled NOT operations, with said first qubit as the control and the second and third qubits as target, fourth qubit as control and the fifth qubit and sixth qubits as target, seventh qubit as control and the eighth and ninth qubits as target.

16. The method of claim 13, wherein said N' qubit expansion includes a three-repetition code used twice for each encoded qubit, said three-repetition code utilized once in an outer layer repeating a triple of qubits three times and once in an inner layer using |000⟩±|111⟩ for each said triple, wherein said repetition code in said outer layer is utilized to correct a single phase error and said repetition code in said inner layer is used to correct a single bit error.

17. The method of claim 13, further including the steps of performing an Exclusive-OR operation on said predetermined groupings prior to said step of comparing; and recovering quantum data from N' qubits of data having undergone decoherence, said step of recovering including the step of applying a quantum NOT operation to selected qubits from said step of comparing, thereby restoring phase errors.

18. The method of claim 17, wherein the decoherence time for a qubit is $t_d$, and said step of recovering $t_r$, takes place at predetermined time intervals, wherein $$t_r \leq \frac{1}{36} t_d.$$

19. The method of claim 17, further including the step of restoring bit errors by application of a function defined by the matrix $$\frac{1}{\sqrt{2}} \begin{pmatrix} 1 & 1 \\ 1 & -1 \end{pmatrix}$$

to said selected qubits.

20. The method of claim 13, wherein said N' qubit expansion includes a combination of an outer correcting code to detect phase errors and an inner correcting code to detect bit errors.

21. A method of recovering quantum data for N' qubits of data having undergone possible decoherence from a superposition of states, said method comprising the steps of:

encoding n qubits of quantum data into an N' qubit expansion according to a predetermined mapping of basis states, wherein n is a positive integer and N' is greater than n; and decoding said expansion by reading said N' qubits in a quantum fashion using an ancilla of extra qubits to thereby detect decoherence and restore said superposition of states, wherein said step of reading includes the step of:

entangling said N' qubits with predetermined other qubits; and measuring said predetermined other qubits.

22. The method of claim 21, wherein said encoding is represented by the expression:

$$|0\rangle \to \frac{1}{2\sqrt{2}} (|000\rangle + |111\rangle)(|000\rangle + |111\rangle)(|000\rangle + |111\rangle)$$

and $$|1\rangle \to \frac{1}{2\sqrt{2}} (|000\rangle - |111\rangle)(|000\rangle - |111\rangle)(|000\rangle - |111\rangle),$$

and wherein said step of decoding includes the steps of:
applying six controlled NOT operations using the first qubit as the control qubit and the second and third qubit as target qubit, the fourth qubit as control and the fifth and sixth qubit as target, seventh as control and eighth and ninth as target, wherein a measurement of the second, third, fifth, sixth, eighth and ninth qubits will result in 0 if no qubits have decohered, and any of these measurements resulting in 1 is indicative that some of these qubits decohered.

23. The method of claim 22, wherein if only one of said measurements is 1, and only one qubit decohered, then the measured qubit is the qubit that has decohered, and wherein if both an ith and (i+1)st qubit are 1, where i=2,5 or 8, then an (i−1)st qubit decohered, wherein said (i−1)st qubit can be restored to a desired state by applying transformation $F_1$, represented by the matrix $$\frac{1}{\sqrt{2}} \begin{pmatrix} 1 & 1 \\ 1 & -1 \end{pmatrix}.$$

24. The method of claim 23, wherein matrix $F_1$, is applied to the first, fourth and seventh qubits, and if no qubits have decohered, then two controlled NOT operations are executed with said first qubit as the control qubit and the fourth and seventh qubits as target and further including the step of:
measuring the fourth and seventh qubits to detect phase errors in the qubits of the encoding, wherein if exactly one of said fourth and seventh qubits is 0 and one is 1, the qubit which was 1 underwent decoherence, the state of the decoded qubit still being accurate, and if both the fourth and seventh qubits are measured to be 1, then a quantum NOT need be applied to the original qubit to restore the pre-coding state.

25. An apparatus for decoding a set of N'(2m+1) exposed qubits, said set of N'(2m+1) exposed qubits having undergone possible decoherence from a superposition of states due to exposure to an environment, said method comprising the steps of:
repetition decoder for decoding said set of N'(2m+1) exposed qubits to yield a set of N' decoded qubits, first logic means for applying a first transformation to each decoded qubit in said set of said N' decoded qubits to yield a set of N' transformed decoded qubits, wherein said first transformation is represented as a unitary matrix comprising matrix entries of equal absolute value, and error correcting decoder for decoding said set of N' transformed decoded qubits to yield a set of n decoded qubits.

26. The apparatus of claim 25, wherein said set of N'(2m+1) exposed qubits was generated by exposing a set of N'(2m+1) qubits to said environment.

27. The apparatus of claim 26, further including means for generating said set of N'(2m+1) qubits, said means including:

error correcting for encoding a set of n qubits to yield a set of N' qubits, wherein said error correcting coder is the inverse of said error correcting decoder, second logic means for applying a second transformation to each qubit in said set of N' qubits to yield a set of N' transformed qubits, wherein said second transformation is the inverse of said first transformation, and repetition coder for encoding said set of N' transformed qubits to yield said set of N'(2m+1) qubits, wherein said repetition coder is the inverse of said repetition decoder.

* * * * *